United States Patent
Hashimoto et al.

(10) Patent No.: US 9,595,602 B2
(45) Date of Patent: Mar. 14, 2017

(54) SWITCHING DEVICE FOR POWER CONVERSION AND POWER CONVERSION DEVICE

(75) Inventors: Takayuki Hashimoto, Tokyo (JP); Mutsuhiro Mori, Tokyo (JP); Masahiro Masunaga, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/418,610

(22) PCT Filed: Sep. 7, 2012

(86) PCT No.: PCT/JP2012/072905
§ 371 (c)(1),
(2), (4) Date: Jan. 30, 2015

(87) PCT Pub. No.: WO2014/038064
PCT Pub. Date: Mar. 13, 2014

(65) Prior Publication Data
US 2015/0303288 A1  Oct. 22, 2015

(51) Int. Cl.
*H01L 29/78* (2006.01)
*H01L 29/739* (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ............. H01L 29/7394; H01L 29/7397; H01L 29/0619; H01L 29/4236; H01L 29/0696; H01L 29/78
See application file for complete search history.

(56) References Cited

U.S. PATENT DOCUMENTS

2005/0161768 A1* 7/2005 Sugiyama ........... H01L 29/4232
257/565
2008/0217649 A1 9/2008 Arai et al.
(Continued)

FOREIGN PATENT DOCUMENTS

EP 1 032 047 A2 8/2000
JP 2000-101076 A 4/2000
(Continued)

OTHER PUBLICATIONS

International Search Report (PCT/ISA/210) dated Nov. 13, 2012, with English translation (Four (4) pages).
(Continued)

*Primary Examiner* — Thomas L Dickey
*Assistant Examiner* — Fazli Erdem
(74) *Attorney, Agent, or Firm* — Crowell & Moring LLP

(57) ABSTRACT

The present invention provides a switching device (100) for power conversion in which a first gate electrode (6), a p-type channel layer (2) having an n-type emitter region (3), a second gate electrode (13), and a p-type floating layer (15) are repeatedly arranged in order on the surface side of an n-type semiconductor substrate (1). An interval a between the two gates (6, 13) that sandwich the p-type channel layer (2) is configured to be smaller than an interval b between the two gates (13, 6) that sandwich the p-type floating layer (15). The first gate electrode (6) and the second gate electrode (13) are both supplied with drive signals having a time difference in drive timing.

14 Claims, 10 Drawing Sheets

(51) Int. Cl.
*H01L 29/423* (2006.01)
*H02M 7/537* (2006.01)
*H01L 29/06* (2006.01)
*H02M 1/08* (2006.01)
*H02M 7/5387* (2007.01)

(52) U.S. Cl.
CPC ...... *H01L 29/4236* (2013.01); *H01L 29/7394* (2013.01); *H02M 1/08* (2013.01); *H02M 7/537* (2013.01); *H01L 29/7396* (2013.01); *H02M 7/5387* (2013.01)

(56) References Cited

U.S. PATENT DOCUMENTS

| 2010/0039844 | A1* | 2/2010 | Arai | H01L 29/0839 363/131 |
|---|---|---|---|---|
| 2011/0204413 | A1 | 8/2011 | Arai et al. | |
| 2015/0221566 | A1* | 8/2015 | Ookura | H01L 29/7397 324/762.09 |

FOREIGN PATENT DOCUMENTS

| JP | 2000-307116 A | 11/2000 |
|---|---|---|
| JP | 2004-319624 A | 11/2004 |
| JP | 2005-191221 A | 7/2005 |
| JP | 2006-222455 A | 8/2006 |
| JP | 2011-119416 A | 6/2011 |
| WO | WO 2011/104850 A1 | 9/2011 |

OTHER PUBLICATIONS

Sumitomo, et al., "Injection Control Technique for High Speed Switching with a double gate PNM-IGBT", Proceedings of the 25$^{th}$ International Symposium on Power Semiconductor Devices & ICs, Kanazawa, 2013, pp. 33-36 (Four (4) pages).

Japanese Office Action issued in counterpart Japanese Application No. 2014-534125 dated Jul. 21, 2015, with English translation (twenty-two (22) pages).

Chinese-language Office Action issued in counterpart Chinese Application No. 201280074588.4 dated Sep. 29, 2016 with partial English translation (12 pages).

* cited by examiner

FIG. 1
(a) CROSS-SECTIONAL DIAGRAM   100 SWITCHING DEVICE FOR POWER CONVERSION
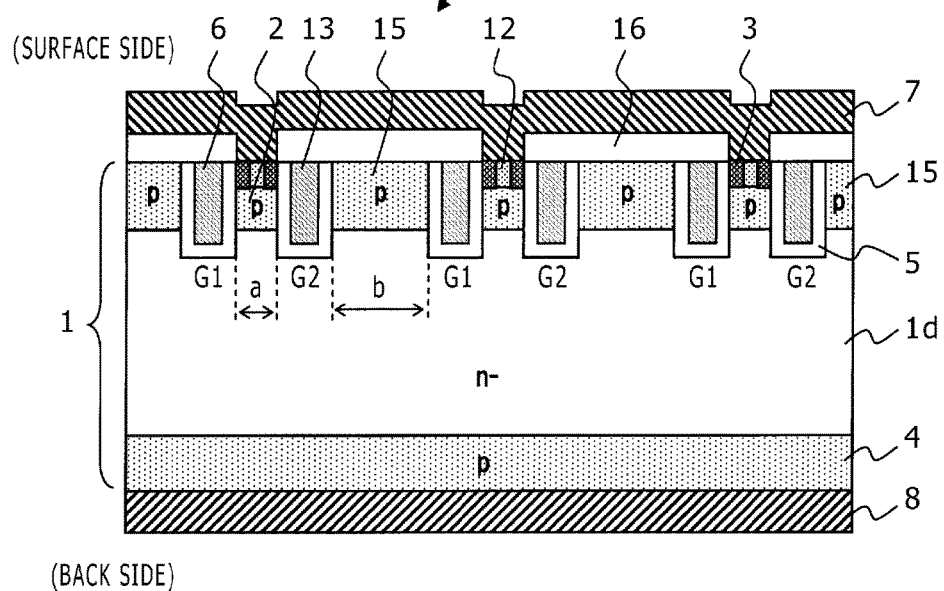
(b) PLANAR LAYOUT DIAGRAM
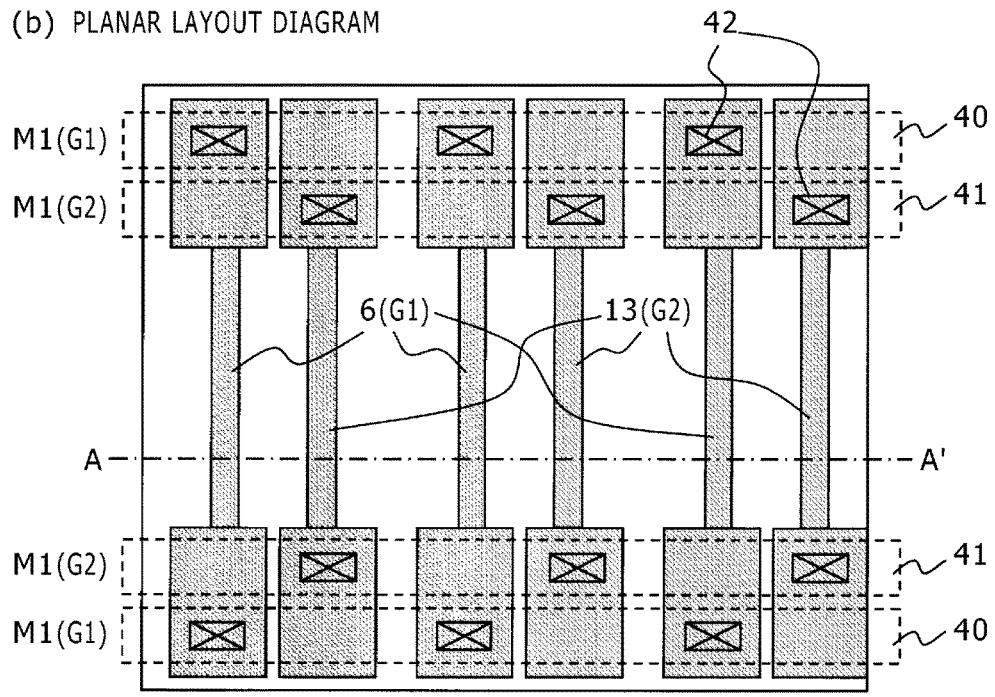

FIG. 10     101 SWITCHING DEVICE FOR POWER CONVERSION
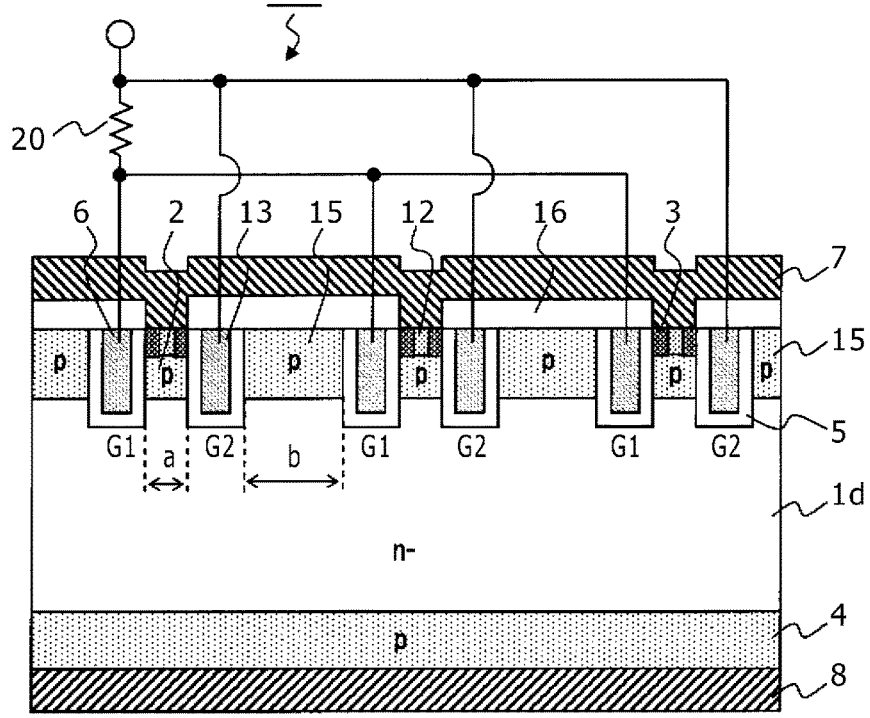
FIG. 11     102 SWITCHING DEVICE FOR POWER CONVERSION
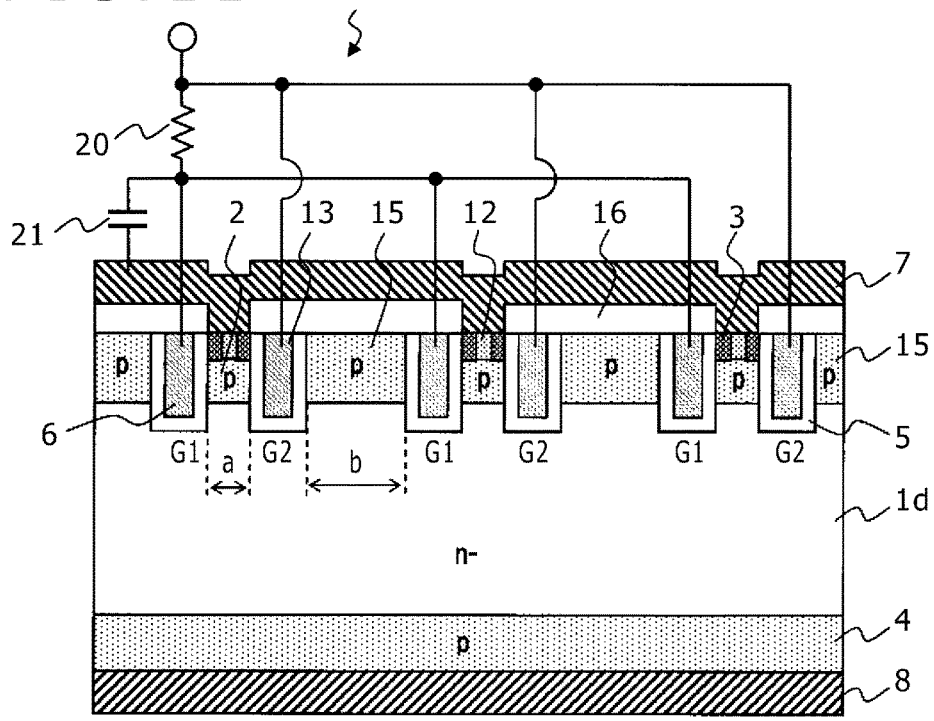

FIG.12
(a) CROSS-SECTIONAL DIAGRAM  103 SWITCHING DEVICE FOR POWER CONVERSION
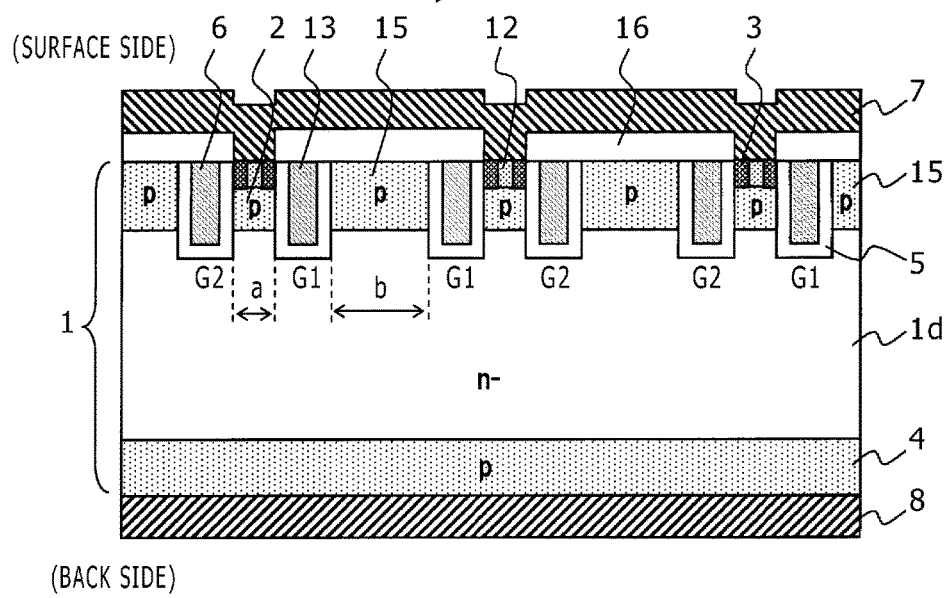
(b) PLANAR LAYOUT DIAGRAM
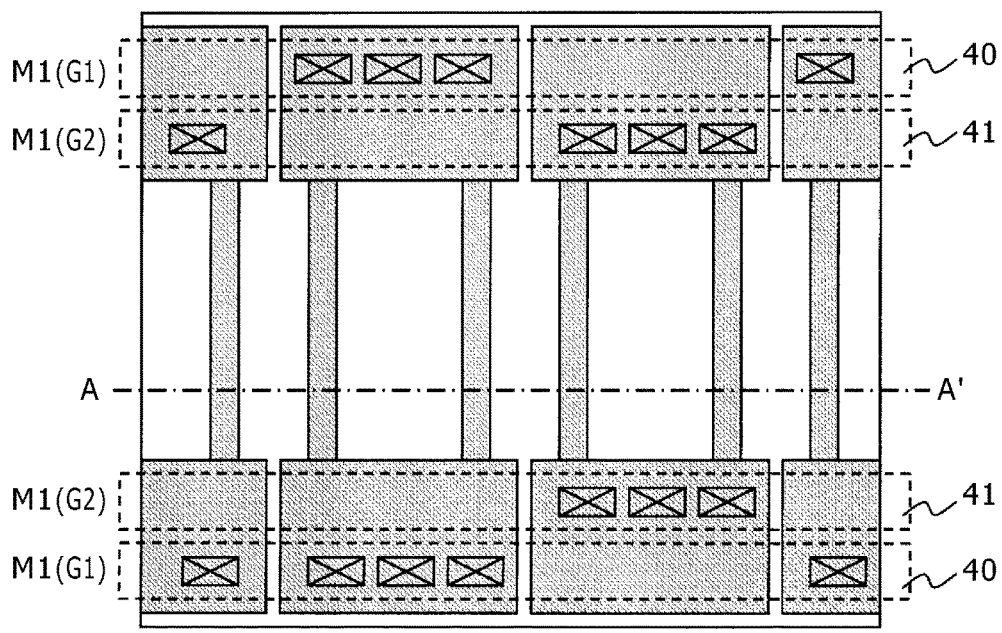

150 SWITCHING DEVICE FOR POWER CONVERSION

1000 POWER CONVERSION DEVICE

SWITCHING DEVICE FOR POWER CONVERSION AND POWER CONVERSION DEVICE

TECHNICAL FIELD

The present invention relates to a switching device for power conversion, and to a power conversion device where the switching device for power conversion is employed.

BACKGROUND ART

In recent years, a switching device for power conversion such as an IGBT (Insulated Gate Bipolar Transistor) has been widely applied, starting from low-power devices including a domestic air conditioner and a microwave oven to high power apparatuses for a railway and an iron factory. Since power conversion from a DC current to an AC current is indispensable to utilize renewable new energy and promote energy saving and vice versa, the switching device for power conversion has been an important key component for realizing a low-carbon society from now on.

Meanwhile, when the switching device for power conversion such as the IGBT is applied to an inverter for power conversion or the like, a conduction loss accompanying an on-resistance occurs during conduction, and a switching loss accompanying a switching operation occurs during switching. Therefore, the conduction loss and the switching loss are both required to be reduced in order to attain high efficiency and miniaturization of the inverter.

An example of an IGBT is disclosed in Patent Document 1, the IGBT being capable of enlarging a safe operation region at the turn-off without impairing the characteristics of low conduction loss, as a result of arranging a plurality of trench-type gates at equal intervals and by supplying control signals, having their turn-off timing shifted, to the mutually adjacent trench-type gates.

Moreover, a description is given in Patent Document 2 regarding an example of an IGBT that is capable of reducing a conduction loss, i.e., an on-state voltage without causing deteriorations in short-circuit tolerance and breakdown voltage in the following steps: alternately arranging a plurality of trench-type gates at two types of intervals different from each other; forming a channel layer (base region) and an emitter region above a semiconductor layer sandwiched by the two gates narrow in the gate interval; and forming a floating layer, which is not connected to an emitter electrode, on a semiconductor layer sandwiched by the two gates wide in the gate interval.

According to the examinations by the present inventors of the present application, however, it has been found that the IGBT having the structure disclosed in Patent Document 2 has problems in that a turn-off loss is large and controllability of the rate of temporal change in the output voltage dv/dt of each diode of the IGBT or a pair of arms deteriorates at the time of turn-on.

One of these problems, which is regarding the deterioration of the controllability of the rate of temporal change in the output voltage (dv/dt) at the turn-on, has been described in Patent Document 3 along with the reason of its occurrence as follows.

Since holes transiently flow into a p-type floating layer formed between two gates when the IGBT is brought to an on-state, the potential of the floating layer turns out to be high. At this time, a displacement current flows in each gate through a feedback capacity of a gate insulating film that separates the gate from the floating layer, thereby raising the potential of the gate. As a result, the rate of temporal change in collector current (ic) (dic/dt) determined by the product of the mutual conductance (gm) of a MOS (Metal Oxide Semiconductor) FET (Field Effect Transistor) structure and the rate of temporal change in gate-emitter voltage (vge) (dvge/dt) increases, and a switching speed is accelerated.

Since the amount of the holes that transiently flow into the floating layer is principally determined by a semiconductor internal structure, it is hard to control it with an external gate resistor. Accordingly, there is generated a period during which the accelerated dic/dt cannot be controlled with the external gate resistor, such that the rate of temporal change in the voltage dv/dt of each of the diodes for the IGBT and the pair of arms cannot be controlled with the gate resistor.

With these taken into consideration, there has been proposed in Patent Document 2 an IGBT having a structure that makes a parasitic capacitance less likely to be generated. The method of that includes thickening an insulating film between a drift layer or floating layer and a gate electrode. The feedback capacity will be smaller too as long as the parasitic capacitance between the above layer and the gate electrode is small. The controllability of the rate of temporal change in the output voltage (dv/dt) at the time of turn-on is improved.

PRIOR ART DOCUMENT

Patent Documents

Patent Document 1: JP-2000-101076-A
Patent Document 2: JP-2006-222455-A
Patent Document 3: JP-2011-119416-A

SUMMARY OF INVENTION

Problems to be Solved by the Invention

Meanwhile, when the p-type floating layer is provided in the n-type drift layer as in the IGBT shown in Patent Document 2, the holes are accumulated in the drift layer during conduction so that the on-state voltage is reduced. On the contrary, since the time required to discharge the accumulated holes turns out to be long at the time of turn-off, the turn-off loss will inevitably be larger. In Patent Document 3, the loss at the turn-off has not been taken into sufficient account.

In view of the problems of the above prior art, an object of the present invention is to provide a switching device for power conversion and a power conversion device capable of reducing a loss at turn-off and improving controllability of the rate of temporal change in output voltage (dv/dt) at turn-on.

Means for Solving the Problems

A switching device for power conversion according to the present invention includes a semiconductor layer of a first conductivity type formed on a semiconductor substrate; a channel layer of a second conductivity type abutting the semiconductor layer of the first conductivity type and formed on a first surface of the semiconductor substrate; a set of gate electrodes including a first gate electrode and a second gate electrode provided to respectively abut two trenches with the semiconductor layer, the channel layer, and a gate insulating film interposed, the trenches being mutually adjacent to a plurality of trenches formed on the first surface of the semiconductor substrate so as to penetrate the channel layer; an emitter region of a first conductivity type formed to abut each of the first gate electrode and the second gate electrode through the gate insulating film, at a part of a surface of the channel layer sandwiched between the first gate electrode and the second gate electrode that belong to a same group in the set of gate electrodes; an emitter electrode to which the emitter region of the first conductivity type and the channel layer of the second conductivity type are electrically connected; a floating layer of a second conductivity type sandwiched between two gate electrodes that belong to a mutually different group of the set of gate electrodes and are adjacent to each other, the floating layer being the channel layer insulated from the emitter electrode; a collector layer of a second conductivity type abutting the semiconductor layer of the first conductivity type and formed on a second surface of the semiconductor substrate; and a collector electrode electrically connected to the collector layer of the second conductivity type. When an interval between the first gate electrode and the second gate electrode that belong to the same set is taken to be a, and an interval between two gate electrodes that belong to the mutually different group and are adjacent to each other is taken to be b, the respective gate electrodes are arranged to meet b>a. When a first drive signal and a second drive signal having a time difference in drive timing are respectively supplied to the first gate electrode and the second gate electrode.

Advantageous Effects of Invention

According to the present invention, there are provided a switching device for power conversion and a power conversion apparatus both capable of reducing a loss at turn-off and improving controllability of the rate of temporal change in output voltage (dv/dt) at turn-on.

BRIEF DESCRIPTION OF THE DRAWINGS

FIG. 1 is a diagram typically illustrating an example of a structure of a switching device for power conversion according to a first embodiment of the present invention, wherein FIG. 1 (a) is an example of a cross-sectional diagram thereof, and FIG. 1 (b) is an example of a planar layout diagram.

FIG. 10 is a diagram illustrating a first modification of the structure of the switching device for power conversion according to the first embodiment of the present invention.

FIG. 11 is a diagram illustrating a second modification of the structure of the switching device for power conversion according to the first embodiment of the present invention.

FIG. 12 is a diagram illustrating a third modification of the structure of the switching device for power conversion according to the first embodiment of the present invention, wherein FIG. 12 (a) is an example of a cross-sectional diagram, and FIG. 12 (b) is an example of a planar layout diagram.

MODE FOR CARRYING OUT THE INVENTION

Figure 2:
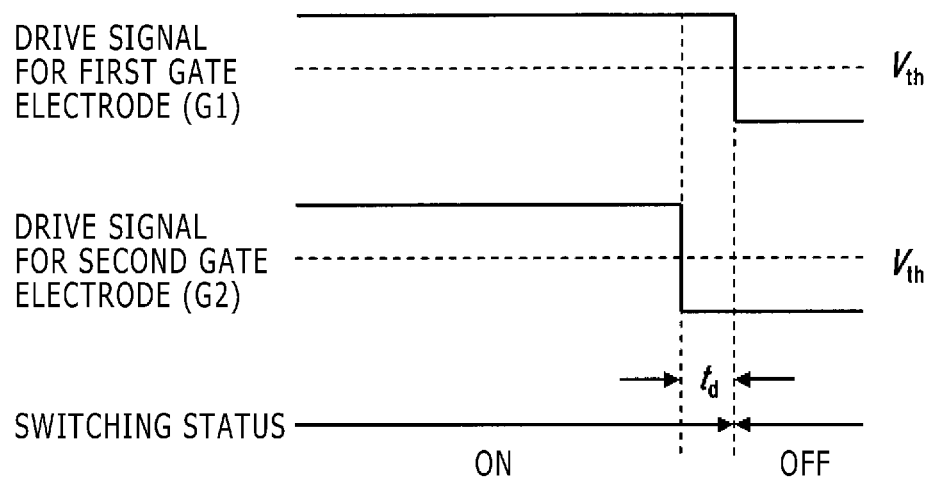
FIG. 2 is a diagram illustrating an example of a drive sequence of drive signals for driving a first gate electrode (G1) and a second gate electrode (G2) when turning off the switching device for power conversion.

Embodiments of the present invention will hereinafter be described in detail with reference to the drawings. In all the drawings for explaining the embodiments, the same reference numerals are attached to the same components, and their repetitive description will be thus omitted.

First Embodiment

FIG. 1 is a diagram typically illustrating an example of a structure of a switching device 100 for power conversion according to a first embodiment of the present invention, wherein FIG. 1 (a) is an example of a cross-sectional diagram thereof, and FIG. 1 (b) is an example of a planar layout diagram. The cross-sectional diagram illustrated in FIG. 1 (a) is a cross-sectional diagram corresponding to a part taken along dashed line A-A' in the planar layout diagram of FIG. 1 (b).

As illustrated in FIG. 1 (a), the switching device 100 for power conversion can be referred to as an IGBT having two independent control gates and has a structure in which a set of trench-type first gate electrodes 6 (G1) and second gate electrodes 13 (G2) arranged adjacent to each other at intervals a are repeatedly arranged on the surface side of an n-type semiconductor substrate 1 such as silicon at intervals b.

The first gate electrode 6 (G1) and the second gate electrode 13 (G2) are configured by, for example, forming a p-type semiconductor layer as a p-type channel layer 2 or a p-type floating layer 15 on the surface side of the n-type semiconductor substrate 1, forming trenches each deeper than the p-type semiconductor layer in the p-type semiconductor layer, forming a gate insulating film 5 on the inner walls of the trenches, and embedding conductive polysilicon or the like in the trenches with the gate insulating film. 5 formed therein.

Further, as illustrated in FIG. 1 (a), in the switching device 100 for power conversion, the p-type channel layer 2 and the p-type floating layer 15 are alternately formed between the first gate electrodes 6 (G1) and the second gate electrodes 13 (G2).

An n-type emitter region 3 (also referred to as a source region) is formed in a part of the surface portion of the p-type channel layer 2, the part abutting both the first gate electrode 6 (G1) and the second gate electrode 13 (G2) with a gate insulating film 5 interposed between the n-type emitter region 3 and the respective electrodes. Further, at a part of the surface portion of the p-type channel layer 2, a p-type emitter region 12 is formed in a portion where no n-type emitter region 3 is formed.

An interlayer insulating film 16 is formed above (outside) the gate electrodes 6 and 13, the n-type emitter region 3, the p-type emitter region 12 and the p-type floating layer 15. Further, an emitter electrode 7 made of a conductive metal or the like is formed above (outside) the interlayer insulating film 16. Each opening is formed in the interlayer insulating film. 16 above the n-type emitter region 3 and the p-type emitter region 12. The n-type emitter region 3 and the p-type emitter region 12 are in contact with the emitter electrode 7 and electrically connected thereto. Meanwhile, the p-type floating layer 15 is insulated from the emitter electrode 7 by means of the interlayer insulating film 16.

In the present embodiment, the interval a between the first gate electrode 6 (G1) and the second gate electrode 13 (G2) sandwiching the region in which the p-type channel layer 2, the n-type emitter region 3 and the p-type emitter region 12 are formed, is taken to be smaller than the interval b between the first gate electrode 6 (G1) and the second gate electrode 13 (G2) sandwiching the region in which the p-type floating layer 15 is formed. That is, the interval a<interval b. Incidentally, when the interval a<b, the advantages such as high-speed switching performance, an improvement in short-circuit tolerance, and a reduction in on-state voltage are obtained (refer to Patent Document 2).

A p-type collector layer 4 is formed on the back side of the n-type semiconductor substrate 1, and a collector electrode 8 made of a conductive metal or the like is formed so as to have contact with the p-type collector layer 4.

Of the n-type semiconductor substrate 1 in FIG. 1 (a), a region excluding the p-type channel layer 2, the n-type emitter region 3, the p-type emitter region 12 and the p-type collector layer 4 is the n-type semiconductor substrate 1 itself, but is normally called an n-type drift layer 1d.

As illustrated in FIG. 1 (b), the first gate electrode 6 (G1) and the second gate electrode 13 (G2) are respectively connected to a first metal wiring 40 and a second metal wiring 41 formed thereabove. In this respect, the first metal wiring 40 and the second metal wiring 41 are independent wirings insulated from each other, which are respectively connected to a first gate terminal and a second gate terminal both not shown. In addition, a gate layer that constitutes the first gate electrode 6 (G1) and the second gate electrode 13 (G2), and a metal wiring layer that constitutes the first metal wiring 40 and the second metal wiring 41 are electrically connected by way of contact holes 42 formed in the interlayer insulating film 16.

As described above, the switching device 100 for power conversion according to the first embodiment of the present invention is characterized by having the first gate electrodes 6 (G1) and the second gate electrodes 13 (G2) that can be driven independently from outside via the first and second gate terminals.

FIG. 2 is a diagram showing an example of a drive sequence of drive signals for driving the first gate electrode 6 (G1) and the second gate electrode 13 (G2) when turning off the switching device 100 for power conversion. It is assumed here that a voltage higher than a threshold voltage Vth has already been applied to both of the first gate electrodes 6 (G1) and the second gate electrodes 13 (G2), and the switching status of the switching device 100 for power conversion is an "on" state.

Incidentally, the threshold voltage Vth mentioned here refers to the lowest voltage at which when a voltage is applied to the first gate electrode 6 (G1) or the second gate electrode 13 (G2), a conduction path (channel) that connects the n-type emitter region 3 and the n-type drift layer 1d is formed within the p-type channel layer 2.

In the present embodiment, as shown in FIG. 2, when the switching device 100 for power conversion is turned off, the drive signal for the first gate electrode 6 (G1) is first changed (turned off) from a state higher than the threshold voltage Vth to a lower state. Also, at the same time, preceding a predetermined time (e.g., 3µ seconds) to the timing of its turn-off, the drive signal for the second gate electrode 13 (G2) is changed (turned off) from a state higher than the threshold voltage Vth to a lower state.

As described above, there can be obtained an advantage that the timing provided for the turn-off is shifted by a predetermined time (e.g., 3µ seconds) in the drive signals for driving each of the first gate electrode 6 (G1) and the second gate electrode 13 (G2) to thereby reduce a turn-off loss of the switching device 100 for power conversion. The reason why this advantage is obtained can be described as follows.

When the voltage of the drive signal for the second gate electrode 13 (G2) is changed (turned off) from the state higher than the threshold voltage Vth to the lower state while the voltage of the drive signal for the first gate electrode 6 (G1) is in the state of being higher than the threshold voltage Vth, the channel connecting the n-type emitter region 3 and the n-type drift layer 1d produced in the p-type channel layer 2 by the second gate electrode 13 (G2) disappears. Therefore, since no electrons are injected into the n-type drift layer 1d through the channel formed on the second gate electrode 13 (G2) side anymore, the amount of holes injected from the p-type collector layer 4 to the n-type drift layer 1d decreases correspondingly.

When in such a situation as above, after the voltage of the drive signal for the first gate electrode 6 (G1) is changed (turned off) from the higher state to the lower state than the threshold voltage Vth, the channel formed on the first gate electrode 6 (G1) side also disappears, and the electrons is not injected into the n-type drift layer 1d through the channel anymore. As a result, the switching status of the switching device 100 for power conversion turns into an "off" state. That is, the switching device 100 for power conversion is turned off.

In this case, the amount of holes accumulated in the n-type drift layer 1d decreases when the voltage of the drive signal for the first gate electrode 6 (G1) is changed (turned off) from the higher state to the lower state than the threshold voltage Vth. The time required to discharge the holes is correspondingly shortened by the decrease. As a result, a turn-off time for the switching device 100 for power conversion turns out to be shorter and its turn-off loss hence will be smaller.

When a time difference $t_d$ in timings, at which the drive signal for the first gate electrode 6 (G1) and the drive signal for the second gate electrode 13 (G2) are turned off, becomes longer, the period during which the on-state voltage increases turns out to be longer as well, resulting in a greater conduction loss. On the contrary, when the time difference $t_d$ is too short, the advantage of reducing the turn-off loss ends up little. Thus, in order to obtain the advantage of a sufficient turn-off loss reduction, the time difference $t_d$ is preferably 3 µs or more.

Figure 3:
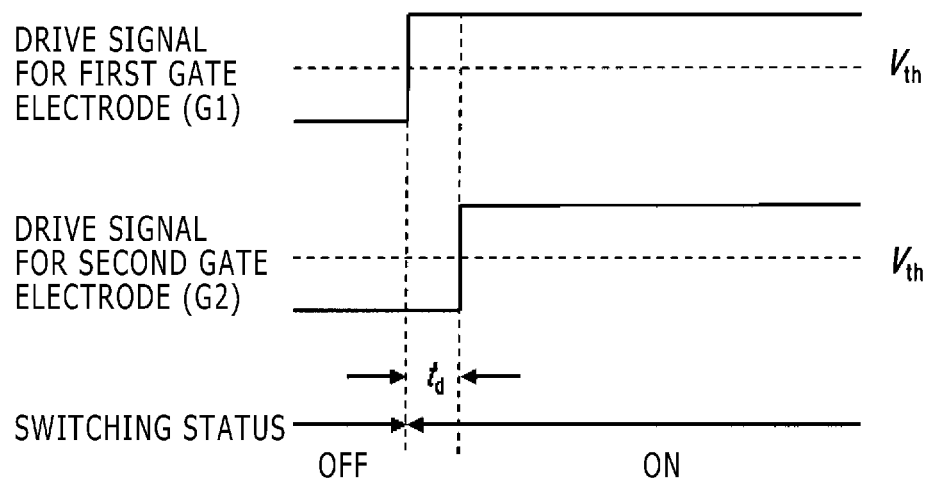
FIG. 3 is a diagram illustrating an example of a drive sequence of drive signals for driving the first gate electrode (G1) and the second gate electrode (G2) when turning on the switching device for power conversion.

FIG. 3 is a diagram showing an example of a drive sequence of drive signals for driving the first gate electrode 6 (G1) and the second gate electrode 13 (G2) when turning on the switching device 100 for power conversion. It is assumed here that a voltage lower than the threshold voltage Vth has already been applied to both of the first gate electrodes 6 (G1) and the second gate electrodes 13 (G2), and the switching status of the switching device 100 for power conversion is an "off" state.

In the present embodiment, as shown in FIG. 3, when the switching device 100 for power conversion is turned on, the drive signal for the first gate electrode 6 (G1) is first changed (turned on) from the lower state to the higher state than the threshold voltage Vth. Also, at the same time, the drive signal for the second gate electrode 13 (G2) is changed (turned on) from the lower state to the higher state than the threshold voltage Vth with being delayed by a predetermined time (e.g., 3µ seconds) from the timing of its turn-on.

As described above, the timing of the turn-off is shifted by the predetermined time (e.g., 3µ seconds) in the drive signals for driving the first gate electrode 6 (G1) and the second gate electrode 13 (G2). The advantage is accordingly obtained that controllability of the rate of temporal change in the output voltage dv/dt of the switching device 100 for power conversion improves. The reason why this advantage is obtained is described as follows.

That is, in the control sequence shown in FIG. 3, the voltage of the drive signal for the second gate electrode 13 (G2) is still being lower than the threshold voltage Vth when the voltage of the drive signal for the first gate electrode 6 (G1) has exceeded the threshold voltage Vth (when it is turned on). The channel that connects the n-type emitter region 3 and the n-type drift layer 1d is not formed on the second gate electrode 13 (G2) side. Therefore, since the electrons are injected into the n-type drift layer 1d through only the channel formed on the first gate electrode 6 (G1) side, the rate of temporal change in collector current dic/dt is not so great that the switching speed is controlled. As a result, the controllability of the rate of temporal change in the output voltage dv/dt of the switching device 100 for power conversion improves.

Incidentally, if a time difference $t_d$ in timings, at which the drive signal for the first gate electrode 6 (G1) and the drive signal for the second gate electrode 13 (G2) are turned off, is too short, the advantage of improving the controllability of the rate of temporal change in the output voltage dv/dt ends up smaller. Accordingly, the time difference $t_d$ is preferably 3 µs or more.

In the description of FIG. 2, the drive signal for the second gate electrode 13 (G2) is turned off before the timing of turning off the drive signal for the first gate electrode 6 (G1), but their order may however be reversed. Likewise, in the description of FIG. 3, the drive signal for the second gate electrode 13 (G2) is turned on with being delayed from the timing at which the drive signal for the first gate electrode 6 (G1) is turned on, but their order may be reversed.

Figure 4:
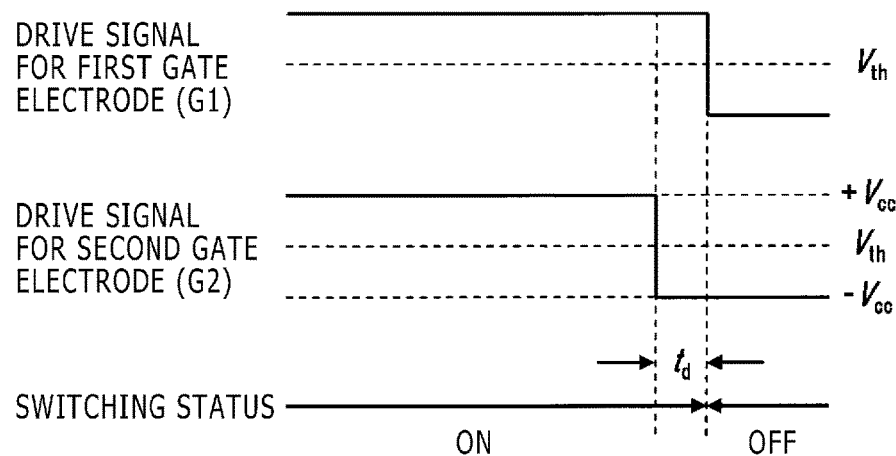
FIG. 4 is a diagram illustrating a second example of a drive sequence of drive signals for driving the first gate electrode (G1) and the second gate electrode (G2) when turning off the switching device for power conversion.

FIG. 4 is a diagram illustrating a second example of a drive sequence of drive signals for driving the first gate electrode 6 (G1) and the second gate electrode 13 (G2) when turning off the switching device 100 for power conversion. This drive sequence differs from that shown in FIG. 2 in that the voltage when the gate of the drive signal for the second gate electrode 13 (G2) is turned off is set to a negative voltage (−Vcc).

If the voltage when the gate of the drive signal for the second gate electrode 13 (G2) is turned off is set to the negative voltage (−Vcc) where the switching device 100 for power conversion is turned off, a p-type accumulation layer is formed over the p-type floating layer 15 that is in contact with the second gate electrode 13 (G2) through the gate insulating film 5. As a result, the discharge of holes at the turn-off is promoted and hence the turn-off loss decreases.

Figure 5:
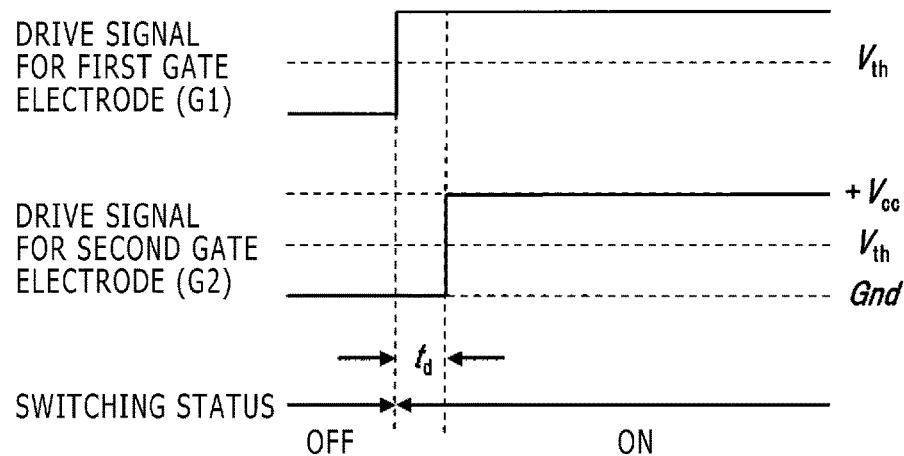
FIG. 5 is a diagram illustrating the second example of the drive sequence of the drive signals for driving the first gate electrode (G1) and the second gate electrode (G2) when turning on the switching device for power conversion.

FIG. 5 is a diagram illustrating a second example of a drive sequence of drive signals for driving the first gate electrode 6 (G1) and the second gate electrode 13 (G2) when turning on the switching device 100 for power conversion. This drive sequence differs from that shown in FIG. 3 in that the voltage when the gate of the drive signal for the second gate electrode 13 (G2) is turned off is set to a ground potential (Gnd).

When the voltage at the time that the gate of the drive signal for the second gate electrode 13 (G2) is turned off is lowered to the negative voltage (−Vcc) where the switching device 100 for power conversion is turned on, a channel that connects the p-type channel layer 2 and the p-type floating layer 15 is formed over the n-type drift layer 1d that abuts the second gate electrode 13 (G2) through the gate insulating film 5. At that time, the potential of the p-type channel layer 2 also changes due to a variation in the potential of the p-type floating layer 15 at the time of the turn-on, and the controllability of the rate of temporal change in the output voltage dv/dt is hence deteriorated. Thus, in the example shown in FIG. 5, the voltage when the gate of the drive signal for the second gate electrode 13 (G2) is turned off is assumed to be the ground potential (Gnd). The ground potential (Gnd) is regarded to have the same potential as the emitter electrode 7 herein.

Figure 6:
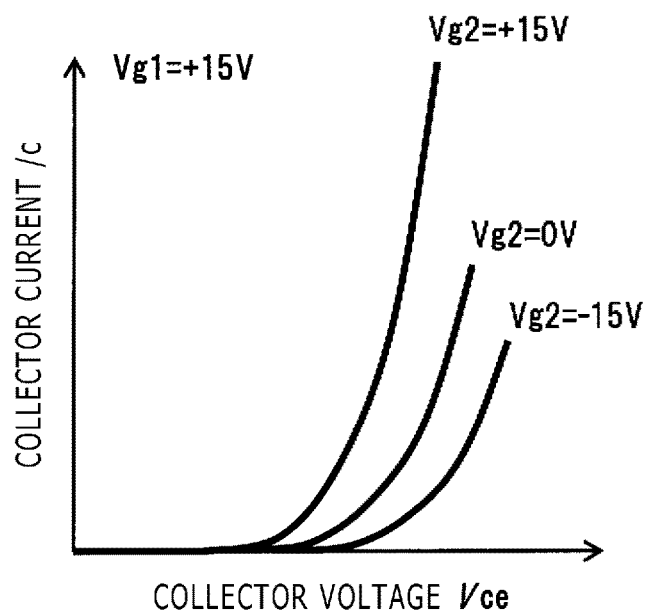
FIG. 6 is a diagram illustrating an example of output characteristics of the switching device for power conversion.

FIG. 6 is a diagram illustrating an example of output characteristics of the switching device 100 for power conversion. This example shows the output characteristics when a voltage Vg1 of the first gate electrode 6 (G1) is fixed to +15V, and a voltage Vg2 of the second gate electrode 13 (G2) is changed to three types: +15V, 0V and −15V. As can be understood from FIG. 6, the on-state voltage becomes the minimum when the voltage Vg2 of the second gate electrode 13 (G2) is +15V, and the on-state voltage becomes the maximum when the voltage Vg2 is −15V.

Therefore, in this embodiment, when the switching device 100 for power conversion is made conductive, the voltage Vg2 of the second gate electrode 13 (G2) is set to +15V to reduce the on-state voltage. At the time of its turn-on, the voltage Vg2 of the second gate electrode 13 (G2) is set to −15V to increase the on-state voltage. In this case, as described in FIG. 4, the turn-off loss decreases. That is, there can be obtained an advantage that the voltage Vg2 of the second gate electrode 13 (G2) is dynamically controlled on a time basis to reduce the on-state voltage, which results in a decline in the turn-off loss.

Figure 7:
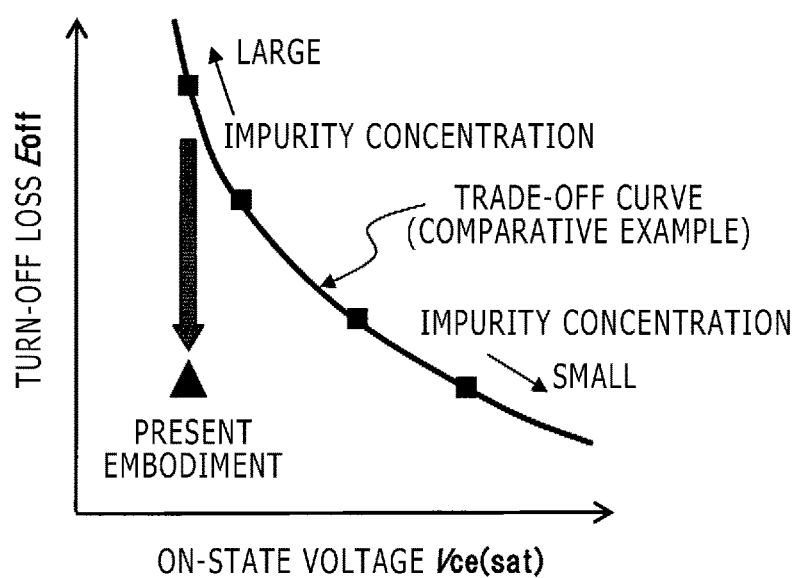
FIG. 7 is a diagram illustrating an example of the effect of an embodiment of the present invention.

FIG. 7 is a diagram illustrating an example of the advantage of the embodiment of the present invention. A trade-off curve of an on-state voltage and a turn-off loss illustrated in FIG. 7 is a trade-off curve of a comparative example.

The comparative example mentioned here refers to the case where the first gate electrode 6 (G1) and the second gate electrode 13 (G2) of the switching device 100 for power conversion shown in FIG. 1 are driven by drive signals at the same timing. Further, the present embodiment refers to a case where the first gate electrode 6 (G1) and the second gate electrode 13 (G2) of the switching device 100 for power conversion shown in FIG. 1 are driven with the use of the drive signals shown in FIG. 2.

In the trade-off curve of the comparative example shown in FIG. 7, the values of the on-state voltage and the turn-off loss at each point represented by black square marks show the values of the on-state voltage and the turn-off loss obtained when the impurity concentration of the p-type collector layer 4 is varied as a parameter. According to the trade-off curve of this comparative example, when the impurity concentration of the p-type collector layer 4 is raised, the on-state voltage drops, but the turn-off loss turns out to be large. Moreover, when the impurity concentration of the p-type collector layer 4 is decreased, the on-state voltage becomes high, but the turn-off loss ends up small. Accordingly, it is understood from the trade-off curve of this comparative example that it is not possible to lower the on-state voltage and reduce the turn-off loss where the impurity concentration of the p-type collector layer 4 is merely changed.

On the contrary, in the present embodiment, even when the impurity concentration of the p-type collector layer 4 corresponds to the black square mark located in the leftmost upper position of the trade-off curve of the comparative example, the turn-off loss is improved to a position represented by a black triangular mark. That is, in the present embodiment, it is understood that in the switching device 100 for power conversion, the on-state voltage can be lowered and the turn-on loss can be reduced.

Further, if judged by extension, it is possible to significantly improve the trade-off between the on-state voltage and the turn-off loss as compared with the comparative example by the following manner: independently driving and controlling the respective drive signals for the first gate electrode 6 (G1) and the second gate electrode 13 (G2) of the switching device 100 for power conversion shown in FIG. 1 while staggering the time of the respective signals.

Figure 8:
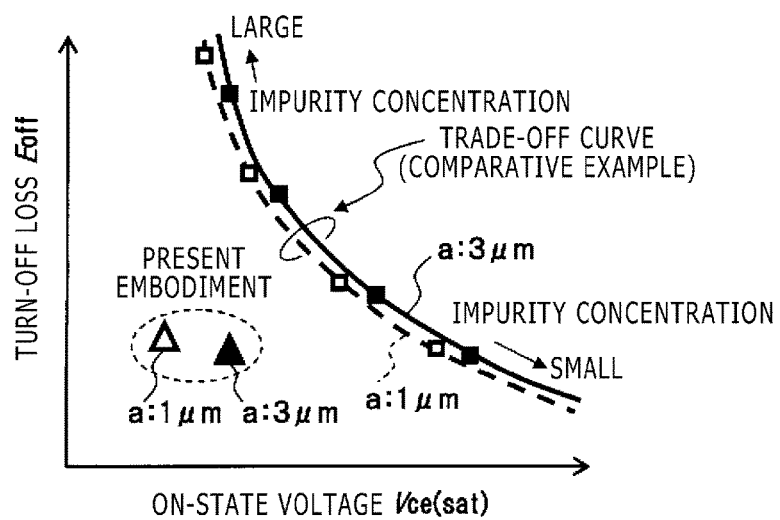
FIG. 8 is a diagram illustrating an example of another effect of the embodiment of the present invention.

FIG. 8 is a diagram illustrating an example of another advantage of the embodiment of the present invention. Incidentally, the meaning of a comparative example referred in FIG. 8 and the present embodiment is the same as the case of FIG. 7.

In FIG. 8 unlike FIG. 7, two trade-off curves of an on-state voltage and a turn-off loss are illustrated in the comparative example. Of the two, the trade-off curve drawn by a solid line including black square marks is a trade-off curve when the interval a between the first gate electrode 6 (G1) and the second gate electrode 13 (G2) in the switching device 100 for power conversion shown in FIG. 1 is set to 3 μm. Further, the trade-off curve drawn by a broken line including white square marks is a trade-off curve when the interval a between the first gate electrode 6 (G1) and the second gate electrode 13 (G2) in the switching device 100 for power conversion shown in FIG. 1 is set to 1 μm.

According to the trade-off curves of the comparative example of FIG. 8, the on-state voltage decreases whereas the turn-on loss increases when the interval a between the first gate electrode 6 (G1) and the second gate electrode 13 (G2) is diminished from 3 μm to 1 μm. Therefore, the trade-off curve itself does not change much. This is because when the interval a between the first gate electrode 6 (G1) and the second gate electrode 13 (G2) is narrowed, the amount of holes to be injected increases and the on-state voltage decreases, while the injected holes contribute to a rise in tail current, which boosts the turn-off loss.

On the contrary, in the present embodiment, when the interval a between the first gate electrode 6 (G1) and the second gate electrode 13 (G2) is narrowed from 3 μm to 1 μm, each on-state voltage and each turn-off loss are moved from a point represented by a black triangular mark in FIG. 8 to a point represented by a white triangular mark. That is, with the reduction in the interval a between the first gate electrode 6 (G1) and the second gate electrode 13 (G2), the on-state voltage decreases and the turn-off loss increases. The amount of the increase in the turn-off loss here is however far less than that in the comparative example.

Thus, in the case of the present embodiment, it is understood that the trade-off between the on-state voltage and the turn-off loss is improved by reducing the interval a between the first gate electrode 6 (G1) and the second gate electrode 13 (G2) from 3 μm to 1 μm.

As that kind of an improvement in the trade-off is seen in like manner even if the interval a between the first gate electrode 6 (G1) and the second gate electrode 13 (G2) is made smaller than 1 μm, the interval a is set to be less than or equal to 1 μm in the present embodiment (switching device 100 for power conversion shown in FIG. 1).

Figure 9:
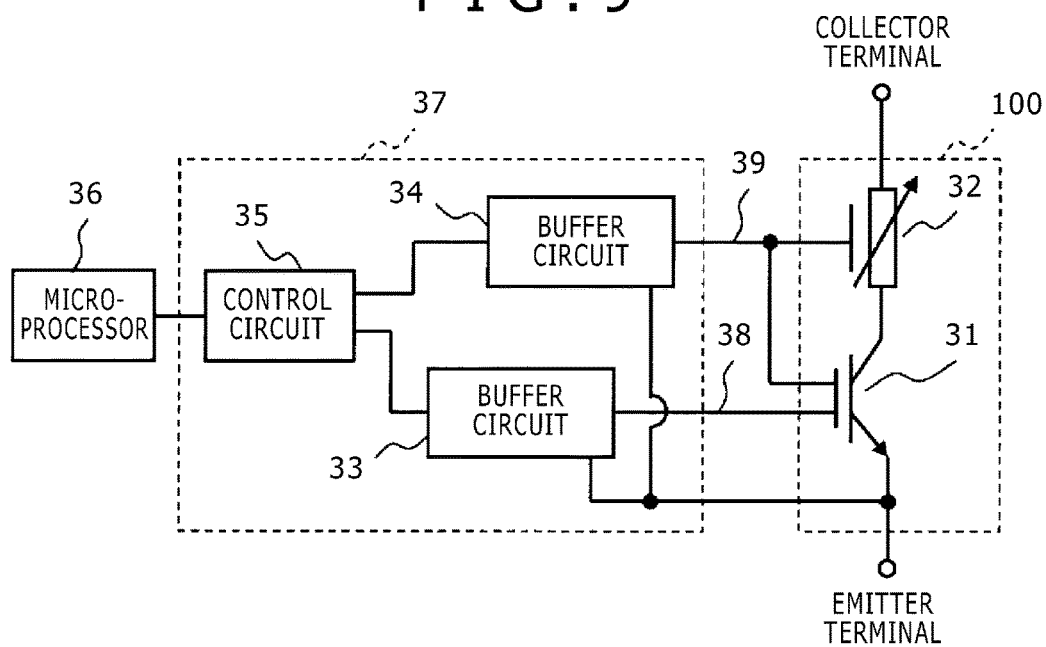
FIG. 9 is a diagram illustrating an example of a block configuration of a drive circuit for realizing the drive sequences of the drive signals illustrated in FIG. 2 to FIG. 5.

FIG. 9 is a diagram illustrating an example of a block configuration of a drive circuit for realizing the drive sequences of the drive signals illustrated in FIG. 2 to FIG. 5. In FIG. 9, the switching device 100 for power conversion driven by such two different drive signals as shown in FIG. 2 to FIG. 5 is represented by an IGBT 31 and a variable resistor 32. The variable resistor 32 is used to represent, on a circuit basis, controlling a physical quantity, which is called the amount of accumulation of holes in the n-type drift layer 1*d*, by use of the second gate electrode 13.

Further, as shown in FIG. 9, the gate drive circuit 37 is configured to include a control circuit 35 and buffer circuits 33 and 34. The control circuit 35 generates two drive signals shifted in timing such as shown in FIG. 2 to FIG. 5 on the basis of a control signal output from a microprocessor 36. The buffer circuits 33 and 34 respectively generate a first drive signal 38 and a second drive signal 39 for driving a switching device 31 in response to one of the drive signals output from the control circuit 35.

That is, the drive signal 38 output from the buffer circuit 33 is input to a gate terminal of the IGBT 31. The drive signal 39 output from the buffer circuit 33 is input to the gate terminal of the IGBT 31 and a resistance control terminal of the variable resistor 32. Physically, the drive signal 38 and the drive signal 39 are respectively coupled to the first gate electrode 6 (G1) and the second gate electrode 13 (G2).

FIG. 10 is a diagram illustrating a first modification of the structure of the switching device for power conversion according to the first embodiment of the present invention. The switching device 100 for power conversion shown in FIG. 1 needs two independent gate terminals (not shown in FIG. 1) to input the drive signals for driving each of the first gate electrode 6 (G1) and the second gate electrode 13 (G2).

Therefore, in the switching device 101 for power conversion according to the first modification, the two independent gate terminals are combined into one. Then, a drive signal for driving the second gate electrode 13 (G2) is input from this combined gate terminal. Thereafter, a drive signal obtained by delaying the drive signal by use of a resistor 20 is input to the first gate electrode 6 (G1).

With these procedures, when the switching device 101 for power conversion is tuned on and off, the drive signals shifted in the timing can be supplied to both the first gate electrode 6 (G1) and the second gate electrode 13 (G2). Thus, the switching device 101 for power conversion according to the first modification can also obtain an advantage that controllability of the rate of temporal change in output voltage dv/dt is improved and a turn-off loss decreases.

In this modification, since the resistor 20 can be realized by being embedded in a semiconductor device called the switching device 101 for power conversion, the gate drive circuit 37 provided outside can be simplified. It is thus possible to achieve a reduction in the cost of a power conversion device such as an inverter that employs the switching device 101 for power conversion.

FIG. 11 is a diagram illustrating a second modification of the structure of the switching device for power conversion according to the first embodiment of the present invention. In the switching device 102 for power conversion according to the second modification, two independent gate terminals are combined into one in a manner similar to the first modification. Then, a drive signal for driving the second gate electrode 13 (G2) is input from this combined gate terminal. Furthermore, a drive signal obtained by delaying the drive signal by use of a resistor 20 and a capacitor 21 is input to the first gate electrode 6 (G1).

As described above, a mechanism for driving the first gate electrode 6 (G1) and the second gate electrode 13 (G2) in the switching device 102 for power conversion is the same as that of the first modification.

The capacitor 21 can also be realized by being embedded in a semiconductor device called the switching device 102 for power conversion in a manner similar to the resistor 20. Thus, the switching device 102 for power conversion according to the second modification can also obtain an advantage similar to that of the switching device 101 for power conversion according to the first modification.

FIG. 12 is a diagram illustrating a third modification of the structure of the switching device for power conversion according to the first embodiment of the present invention, in which FIG. 12 (a) is an example of a cross-sectional diagram, and FIG. 12 (b) is an example of a planar layout diagram. The cross-sectional diagram shown in FIG. 12 (a) is a cross-sectional diagram corresponding to a portion taken along dashed line A-A' in the planar layout diagram of FIG. 12 (b).

A point of difference between the switching device 103 for power conversion shown in FIG. 12 and the switching device 100 for power conversion shown in FIG. 1 resides in how to repeatedly arrange each set of the first gate electrode 6 (G1) and the second gate electrode 13 (G2). That is, in the switching device 100 for power conversion shown in FIG. 1, the set of the first gate electrode 6 (G1) and the second gate electrode 13 (G2) is repeatedly laid out while being moved in parallel in a way like (G1-G2)-(G1-G2)- . . . . In contrast, in the switching device 103 for power conversion shown in FIG. 12, the set of the first gate electrode 6 (G1) and the second gate electrode 13 (G2) is repeatedly laid out while their positions are being reversed with each other in a way like (G1-G2)-(G2-G1)- . . . .

It is apparent from the description made so far that an advantage similar to that of the switching device 100 for power conversion shown in FIG. 1 is obtained in the following conditions. These first and second gate electrodes 6 (G1) and 13 (G2) should be driven with the use of the drive signals shown in FIG. 2 to FIG. 5. The conditions are satisfied even if the set of the first gate electrode 6 (G1) and the second gate electrode 13 (G2) is repeatedly laid out in this manner above while their positions are being reversed with each other in the switching device 103 for power conversion.

In the case of the third modification, the same first gate electrodes 6 or second gate electrodes 13 are adjacent to each other through the p-type floating layer 15 side. Accordingly, as shown in FIG. 12 (b), the adjoining first gate electrodes 6 or the adjoining second gate electrodes 13 can be coupled to each other in regions in which the gate electrodes 6 and 13 are made to communicate with their upper metal wirings 40 and 41. Thus, since it is possible to enlarge the area of each of gate electrode regions for both electrodes in the regions where the gate electrodes 6 and 13 and the metal wirings 40 and 41 are respectively connected, contact holes 42 that connect the gate electrodes 6 and 13 to the metal wirings 40 and 41 can be more provided in the gate electrode regions. It is thus possible to reduce their contact resistance and the resistance of each gate electrode region.

Accordingly, in the switching device 103 for power conversion according to the third modification, the stable drive signals of higher stability are input to the first gate electrodes 6 (G1) and the second gate electrodes 13 (G2).

Second Embodiment

Figure 13:
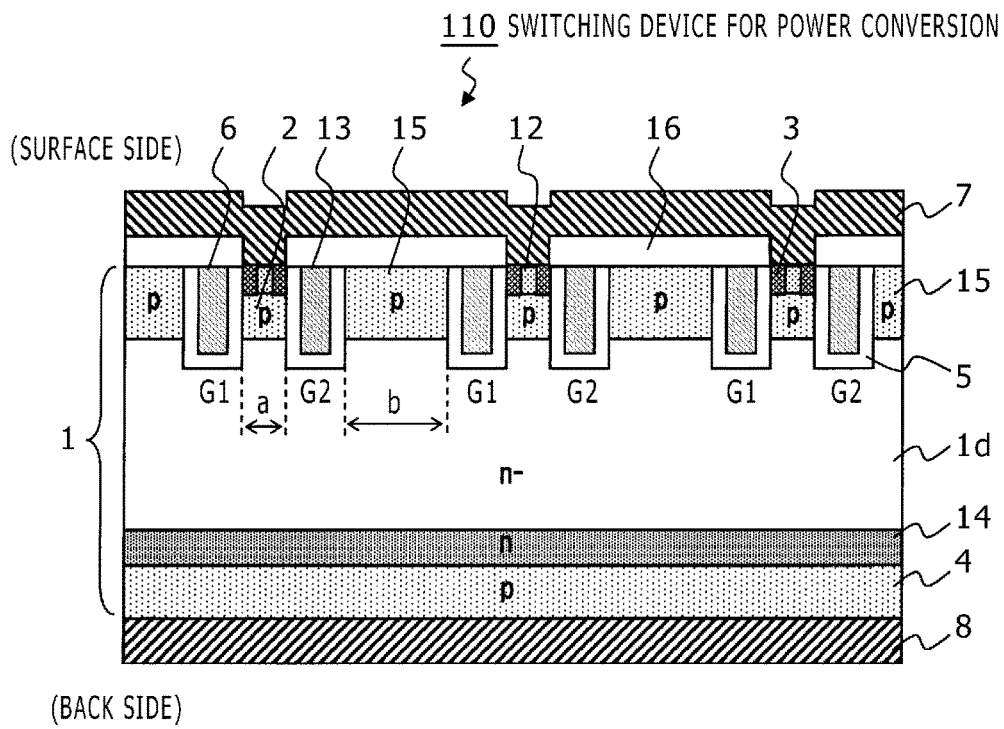
FIG. 13 is a diagram typically illustrating an example of a structure of a switching device for power conversion according to a second embodiment of the present invention.

FIG. 13 is a diagram typically illustrating an example of a structure of a switching device 110 for power conversion according to a second embodiment of the present invention.

As shown in FIG. 13, the structure of the switching device 110 for power conversion according to the second embodiment is almost the same as that of the switching device 100 for power conversion according to the first embodiment shown in FIG. 1. Yet they are different in that an n-type buffer layer 14 is provided in the interface of the p-type collector layer 4 and the n-type drift layer 1d in the switching device 110 for power conversion according to the second embodiment.

The n-type buffer layer 14 has a role of preventing a depletion layer, extending from interfaces toward the n-type drift layer 1d, from reaching the p-type collector 4 in a state in which the switching layer 110 for power conversion is turned off, the interface being between the p-type channel layer 2 and the n-type drift layer 1d, the other one being between the p-type floating layer 15 and the n-type drift layer 1d. The impurity concentration of this n-type buffer layer 14 is formed to be higher than that of the n-type drift layer 1d.

Further, in the second embodiment as well, the first gate electrode 6 (G1) and the second gate electrode 13 (G2) are each driven with the drive signals shown in FIG. 2 to FIG. 5 at different times. Thus, even in this case, an advantage similar to that in the first embodiment can be obtained. That is, a turn-off loss decreases even in the switching device 110 for power conversion, and controllability of the rate of temporal change in the output voltage dv/dt is improved.

Third Embodiment

Figure 14:
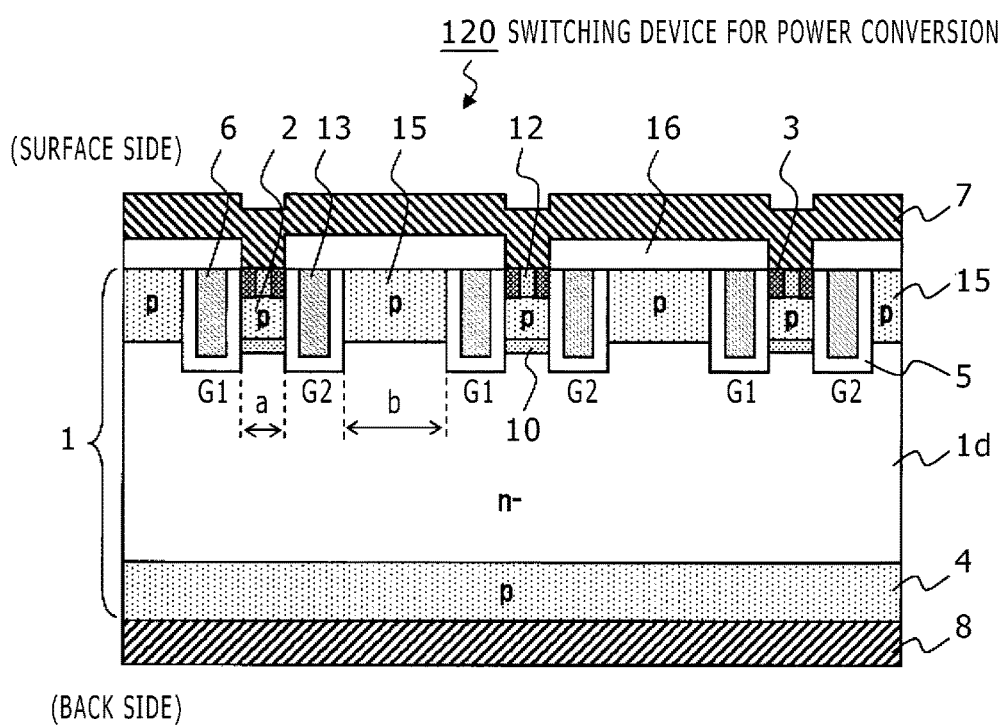
FIG. 14 is a diagram typically illustrating an example of a structure of a switching device for power conversion according to a third embodiment of the present invention.

FIG. 14 is a diagram typically illustrating an example of a structure of a switching device 120 for power conversion according to a third embodiment of the present invention.

As shown in FIG. 14, the structure of the switching device 120 for power conversion according to the third embodiment is almost the same as that of the switching device 100 for power conversion according to the first embodiment shown in FIG. 1. Yet they are different in that an n-type hole barrier layer 10 is provided in the interface of the p-type channel layer 2 and the n-type drift layer 1*d* in the switching device 120 for power conversion according to the third embodiment.

The n-type hole barrier layer 10 has roles of blocking holes injected from the p-type collector layer 4 and reducing the resistance of the n-type drift layer 1*d*.

Further, in the third embodiment as well, the first gate electrode 6 (G1) and the second gate electrode 13 (G2) are driven with the drive signals shown in FIG. 2 to FIG. 5 at different times. Thus, even in this case, an advantage similar to that in the first embodiment can be obtained. That is, a turn-off loss decreases even in the switching device 140 for power conversion, and controllability of the rate of temporal change in the output voltage dv/dt is improved.

Fourth Embodiment

Figure 15:
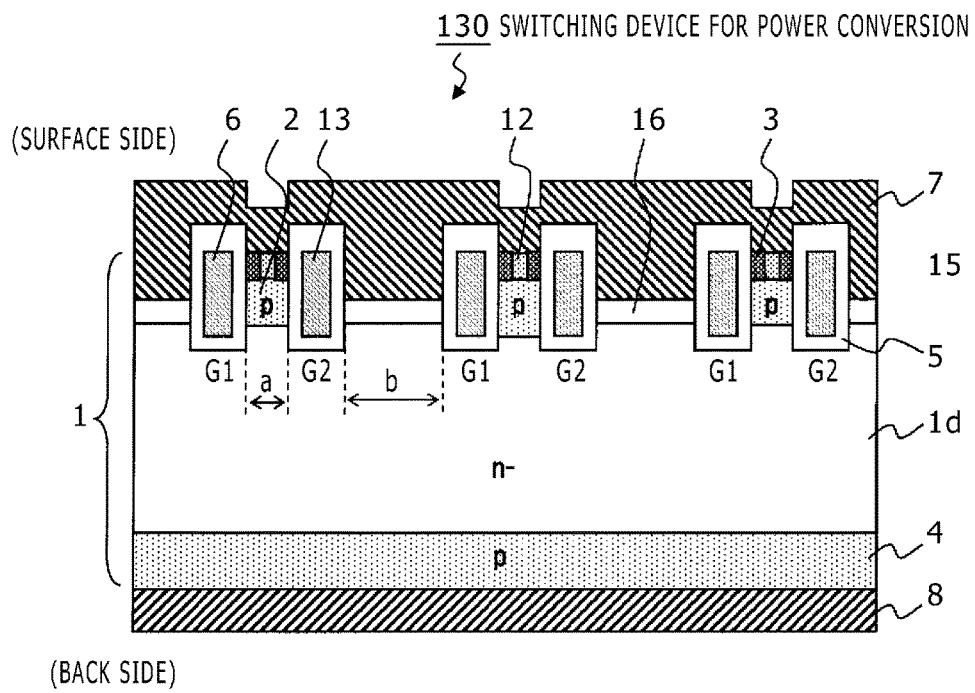
FIG. 15 is a diagram typically illustrating an example of a structure of a switching device for power conversion according to a fourth embodiment of the present invention.

FIG. 15 is a diagram typically illustrating an example of a structure of a switching device 130 for power conversion according to a fourth embodiment of the present invention.

As shown in FIG. 15, the structure of the switching device 130 for power conversion according to the fourth embodiment is almost the same as that of the switching device 100 for power conversion according to the first embodiment shown in FIG. 1. Yet they are different in that the switching device 130 is not provided with the p-type floating layer 15 mounted on the switching device 100 for power conversion according to the first embodiment.

Moreover, in the fourth embodiment as well, the first gate electrode 6 (G1) and the second gate electrode 13 (G2) are driven with the drive signals shown in FIG. 2 to FIG. 5 at different times. In that case, as with the case of the first embodiment, a turn-off loss decreases and controllability of the rate of temporal change in the output voltage dv/dt is improved. Incidentally, the reason why the controllability of the rate of temporal change in the output voltage dv/dt is improved is as follows: the application of a voltage lower than or equal to the threshold to the second gate electrode 13 (G2) at the time of turn-on decreases the rate of temporal change in collector current dic/dt, whereby a switching speed is controlled.

Fifth Embodiment

Figure 16:
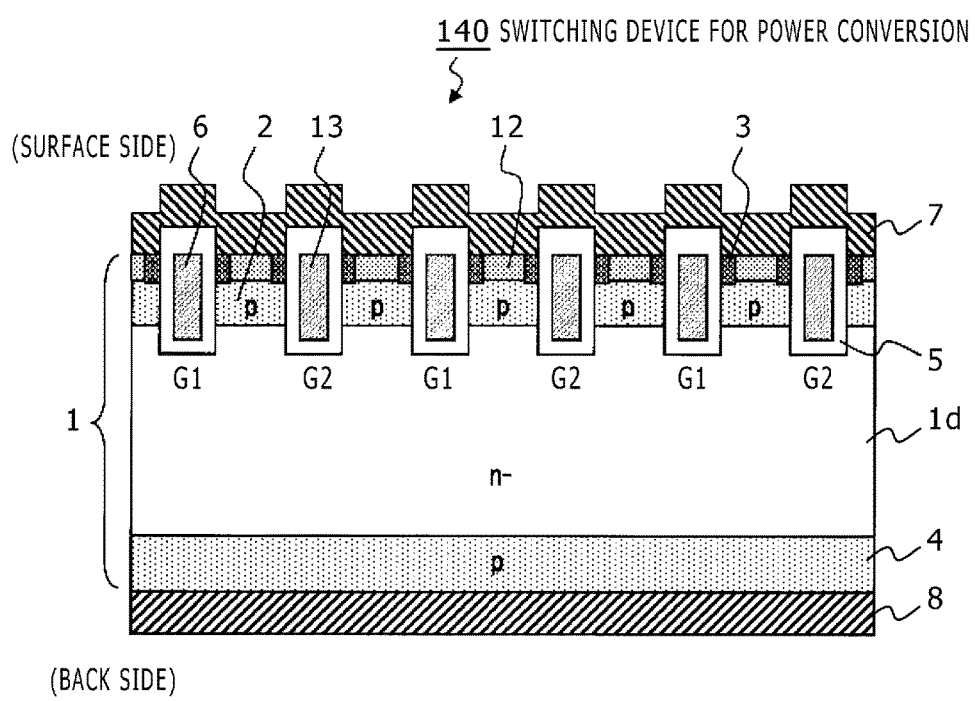
FIG. 16 is a diagram typically illustrating an example of a structure of a switching device for power conversion according to a fifth embodiment of the present invention.

FIG. 16 is a diagram typically illustrating an example of a structure of a switching device 140 for power conversion according to a fifth embodiment of the present invention.

As shown in FIG. 16, in the switching device 140 for power conversion according to the fifth embodiment, trench-type first gate electrodes 6 (G1) and second gate electrodes 13 (G2) are arranged at approximately equal intervals on the surface side of an n-type semiconductor substrate 1. Then, a p-type collector layer 4, an n-type emitter region 3 and a p-type emitter region 12 are formed on the n-type semiconductor substrate 1 between the trench-type first gate electrode 6 (G1) and second gate electrode 13 (G2). Further, the n-type emitter region 3 and the p-type emitter region 12 are connected to an emitter electrode 7 provided on their upper surface sides. Incidentally, in the present embodiment, the layer or region corresponding to the p-type floating layer 15 referred to in the switching device 100 for power conversion according to the first embodiment is not provided.

Moreover, a p-type collector layer 4 is formed on the n-type semiconductor substrate 1 on the back side of the switching device 140 for power conversion. The p-type collector layer 4 is coupled to a collector electrode 8.

In the fifth embodiment as well, the first gate electrode 6 (G1) and the second gate electrode 13 (G2) are driven with the drive signals shown in FIG. 2 to FIG. 5 at different times. In that case, as with the case of the first embodiment, a turn-off loss decreases and controllability of the rate of temporal change in the output voltage dv/dt is improved. The reason that the controllability of the rate of temporal change in the output voltage dv/dt is improved is the same as the case of the fourth embodiment; the application of a voltage lower than or equal to the threshold to the second gate electrode 13 (G2) at the time of turn-on decreases the rate of temporal change in collector current dic/dt, whereby a switching speed is controlled.

Sixth Embodiment

Figure 17:
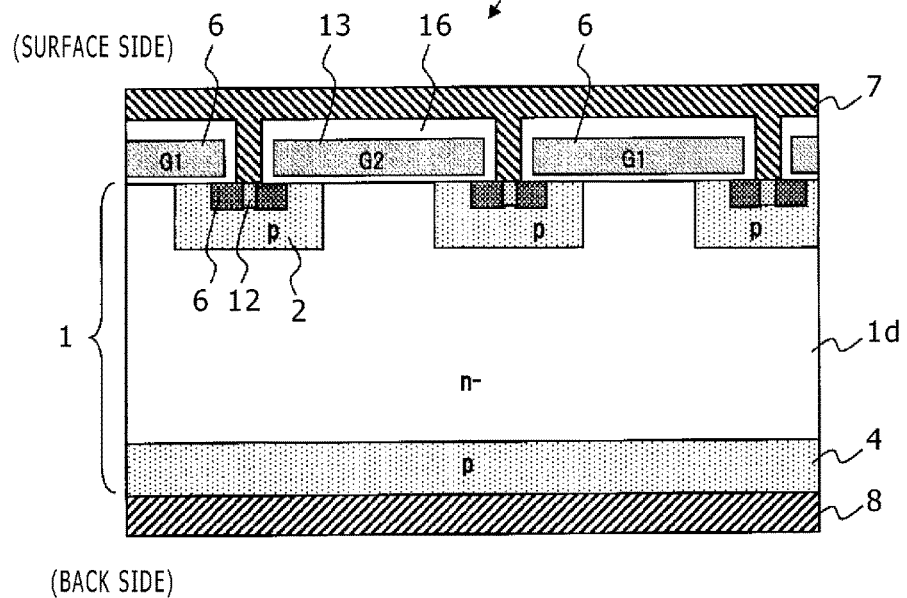
FIG. 17 is a diagram typically illustrating an example of a structure of a switching device for power conversion according to a sixth embodiment of the present invention.

FIG. 17 is a diagram typically illustrating an example of a structure of a switching device 150 for power conversion according to a sixth embodiment of the present invention.

As shown in FIG. 17, in the switching device 150 for power conversion according to the fifth embodiment, planar type first gate electrodes 6 (G1) and second gate electrodes 13 (G2) are arranged at approximately equal intervals on the surface side of an n-type semiconductor substrate 1. Then, a p-type collector layer 4, an n-type emitter region 3 and a p-type emitter region 12 are formed on the n-type semiconductor substrate 1 between the trench-type first gate electrode 6 (G1) and second gate electrode 13 (G2). Further, the n-type emitter region 3 and the p-type emitter region 12 are connected to an emitter electrode 7 provided on their upper surface sides. Incidentally, in the present embodiment, the layer or region corresponding to the p-type floating layer 15 referred to in the switching device 100 for power conversion according to the first embodiment is not provided.

Moreover, a p-type collector layer 4 is formed on the n-type semiconductor substrate 1 on the back side of the switching device 150 for power conversion. The p-type collector layer 4 is coupled to a collector electrode 8.

Further, in the sixth embodiment as well, the first gate electrode 6 (G1) and the second gate electrode 13 (G2) are driven with the use of the drive signals shown in FIG. 2 to FIG. 5 at different times. In that case, as with the case of the first embodiment, a turn-off loss decreases and controllability of the rate of temporal change in the output voltage dv/dt is improved. Incidentally, the reason why the controllability of the rate of temporal change in the output voltage dv/dt is improved is that as with the case of the fourth embodiment, application of a voltage lower than or equal to the threshold to the second gate electrode 13 (G2) at the time of turn-on decreases the rate of temporal change in collector current dic/dt, whereby and a switching speed is controlled.

Seventh Embodiment

Figure 18:
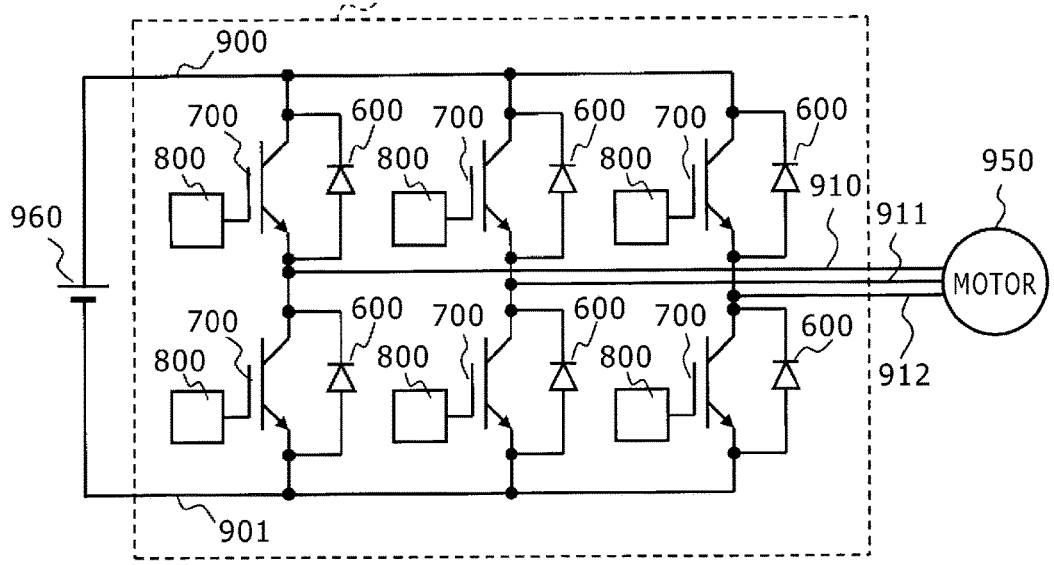
FIG. 18 is a diagram illustrating an example of a circuit configuration of a power conversion device to which the switching device for power conversion according to each of the first through sixth embodiments of the present invention is applied.

FIG. 18 is a diagram illustrating an example of a circuit configuration of a power conversion device 1000 to which each of the switching devices 100, 110, 120, 130, 140 and 150 for power conversion according to the first through sixth embodiments of the present invention is applied. Such a power conversion device 1000 is generally called an inverter device and used for, for example, converting electric energy, coming from a DC power supply 960, to an AC current of a desired frequency and controlling the number of rotations of a motor 950 at a variable speed.

As shown in FIG. 18, a positive electrode of the DC power supply 960 is connected to a P terminal 900 of the power conversion device 1000, while a negative electrode thereof is connected to an N terminal 901. Further, three-phase AC currents, output from an U terminal 910, a V terminal 911 and a W terminal 912, are connected to the motor 950.

A circuit in which two switching devices 700 for power conversion are connected in series is provided three in parallel between the P terminal 900 and the N terminal 901. Further, connection points that connect the two switching devices 700 for power conversion in the respective circuits in series are respectively connected to the U terminal 910, the V terminal 911 and the W terminal 912. Incidentally, the switching device 700 for power conversion referred to here indicate any of the switching devices 100, 110, 120, 130, 140 and 150 for power conversion according to the first to sixth embodiments.

The so-called upper-arm side switching devices 700 for power conversion have each of their collector electrodes 8 connected to the P terminal 900 as well as have their emitter electrodes 7 respectively connected to the U terminal 910, the V terminal 911 and the W terminal 912. Moreover, the so-called lower-arm side switching devices 700 for power conversion have each of their emitter electrodes 7 connected to the N terminal 901, as well as have their collector electrodes 8 respectively connected to the U terminal 910, the V terminal 911 and the W terminal 912.

Then, the phases of timing to turn on and off the respective switching devices 700 for power conversion are changed and controlled by means of respective gate drive circuits 800, whereby the three-phase AC currents from the U terminal 910, the V terminal 911 and the W terminal 912 are output. Incidentally, the gate drive circuits 800 referred to here correspond to the gate drive circuit 37 shown in FIG. 9.

Further, flywheel diodes 600 are connected in reversely parallel to the respective switching devices 700 for power conversion. For example, when each of the upper-arm side switching devices 700 for power conversion is turned off, the flywheel diode 600 commutes the flowing of a current flowing through the switching device 700 for power conversion to the flywheel diode 600 connected in reversely parallel to the lower-arm side switching device 700 for power conversion to thereby release energy stored in each coil of the motor 950. Further, the same applies even to the case where the lower-arm side switching devices 700 for power conversion are turned off.

In the power conversion device 1000 configured as described above, a conduction loss occurs when each switching device 700 for power conversion is made conductive, and a switching loss occurs during its on/off. In the present embodiment, however, since the switching devices 100, 110, 120, 130, 140 and 150 for power conversion, which have been described in the first to sixth embodiments, are used as the switching devices 700 for power conversion, the conduction and switching losses as the power conversion device 1000 are reduced.

The configuration of the power conversion device 1000 shown in FIG. 18 is only one of examples. Even if the power conversion device is one that outputs AC current of two phases or one that converts an AC current into a DC current, an advantage similar to that in the present embodiment will be obtained.

Further, in the present specification, the n-type channel MOSFET is used for the gate portion in each of the switching devices 100, 110, 120, 130, 140 and 150 for power conversion, but a p-type channel MOSFET may be used therefor as well.

REFERENCE NUMERALS

1 n-type semiconductor substrate (semiconductor substrate of first conductivity type)
1$d$ n-type drift layer (first conductivity type semiconductor layer)
2 p-type channel layer (second conductivity type channel layer)
3 n-type emitter region (first conductivity type emitter region)
4 p-type collector layer (second conductivity type collector layer)
5 gate insulating film
6 first gate electrode (G1)
7 emitter electrode
8 collector electrode
10 n-type hole barrier layer (hole barrier layer of first conductivity type)
12 p-type emitter region
13 second gate electrode (G2)
14 n-type buffer layer (buffer layer of first conductivity type)
15 p-type floating layer
16 interlayer insulating film
20 resistor
21 capacitor
31 IGBT
32 variable resistor
33, 34 buffer circuit
35 control circuit
36 microprocessor
37 gate drive circuit
40 first metal wiring
41 second metal wiring
42 contact hole
100, 101, 102, 103 switching device for power conversion
110, 120, 130, 140, 150 switching device for power conversion
600 flywheel diode (diode)
700 switching device for power conversion
800 gate drive circuit
900 P terminal
901 N terminal
910 U terminal
911 V terminal
912 W terminal
950 motor
960 DC power supply

The invention claimed is:

1. A switching device for power conversion, comprising:
a semiconductor layer of a first conductivity type formed on a semiconductor substrate;
a channel layer of a second conductivity type abutting the semiconductor layer of the first conductivity type and formed on a first surface of the semiconductor substrate;
a set of gate electrodes comprising a first gate electrode and a second gate electrode provided to respectively abut two trenches with the semiconductor layer, the channel layer, and a gate insulating film interposed, the trenches being mutually adjacent to a plurality of trenches formed on the first surface of the semiconductor substrate so as to penetrate the channel layer;

an emitter region of a first conductivity type formed to abut each of the first gate electrode and the second gate electrode through the gate insulating film, at a part of a surface of the channel layer sandwiched between the first gate electrode and the second gate electrode that belong to a same group in the set of gate electrodes;

an emitter electrode to which the emitter region of the first conductivity type and the channel layer of the second conductivity type are electrically connected;

a floating layer of a second conductivity type sandwiched between two gate electrodes that belong to a mutually different group of the set of gate electrodes and are adjacent to each other, the floating layer being the channel layer insulated from the emitter electrode;

a collector layer of a second conductivity type abutting the semiconductor layer of the first conductivity type and formed on a second surface of the semiconductor substrate; and a collector electrode electrically connected to the collector layer of the second conductivity type, wherein when an interval between the first gate electrode and the second gate electrode that belong to the same set is taken to be a, and an interval between two gate electrodes that belong to the mutually different group and are adjacent to each other is taken to be b, the respective gate electrodes are arranged to meet b>a, and wherein a first drive signal and a second drive signal having a time difference in drive timing are respectively supplied to the first gate electrode and the second gate electrode.

2. The switching device for power conversion according to claim 1, wherein a time difference between a timing at which the first drive signal is turned off and a timing at which the second drive signal is turned off is 3μ seconds or more.

3. The switching device for power conversion according to claim 1, wherein a time difference between a timing at which the first drive signal is turned on and a timing at which the second drive signal is turned on is 3μ seconds or more.

4. The switching device for power conversion according to claim 3, wherein the interval a between the first gate electrode and the second gate electrode that belong to the same group is less than or equal to 1 μm.

5. The switching device for power conversion according to claim 1,
wherein the first gate electrode and the second gate electrode are connected through a resistor, and
wherein the first drive signal for driving the first gate electrode is a signal obtained by delaying, by use of the resistor, the second drive signal for driving the second gate electrode.

6. The switching device for power conversion according to claim 1,
wherein the first gate electrode and the second gate electrode are connected through a resistor,
wherein the first gate electrode and the emitter electrode are connected through a capacitor, and
wherein the first drive signal for driving the first gate electrode is a signal obtained by delaying, by use of the resistor and the capacitor, the second drive signal for driving the second gate electrode.

7. The switching device for power conversion according to claim 1, wherein a buffer layer of a first conductivity type higher in impurity concentration than the semiconductor layer of the first conductivity type is formed between the semiconductor layer of the first conductivity type and the collector layer of the second conductivity type.

8. The switching device for power conversion according to claim 1, wherein a hole barrier layer of a first conductivity type higher in impurity concentration than the semiconductor layer of the first conductivity type is formed at a boundary portion between the channel layer and the semiconductor layer of the first conductivity type, the channel layer being sandwiched between the first gate electrode and the second gate electrode that belong to the same group in the set of the first gate electrodes and the second gate electrodes.

9. A switching device for power conversion, comprising:
a semiconductor layer of a first conductivity type formed on a semiconductor substrate;
a channel region of a second conductivity type abutting the semiconductor layer of the first conductivity type and formed on a first surface of the semiconductor substrate;
a gate electrode provided to abut both the channel region of the second conductivity type and the semiconductor layer of the first conductivity type through a gate insulating film;
an emitter region of a first conductivity type provided in a position apart from the semiconductor layer of the first conductivity type within the channel region in such a manner that a part of the emitter region abuts the gate electrode through the gate insulating film;
an emitter electrode to which the emitter region of the first conductivity type and the channel region of the second conductivity type are electrically connected;
a collector layer of a second conductivity type abutting the semiconductor layer of the first conductivity type and formed on a second surface of the semiconductor substrate; and
a collector electrode electrically connected to the collector layer of the second conductivity type,
wherein the gate electrode is separated into a first gate electrode and a second gate electrode respectively supplied with a first drive signal and a second drive signal having a time difference in drive timing, and
wherein the first gate electrode and the second gate electrode are alternately arranged on the first surface of the semiconductor substrate.

10. The switching device for power conversion according to claim 9, wherein a time difference between a timing at which the first drive signal is turned off and a timing at which the second drive signal is turned off is 3μ seconds or more.

11. The switching device for power conversion according to claim 9, wherein a time difference between a timing at which the first drive signal is turned on and a timing at which the second drive signal is turned on is 3μ seconds or more.

12. A power conversion device configured to include:
a pair of DC terminals;
a DC-AC conversion circuit configured to connect two current switching devices for turning on and off a current in series between the DC terminals; and
an AC terminal connected to a point to which the two current switching devices of the DC-AC conversion circuit are connected,
wherein the current switching devices are the switching device for power conversion according to claim 1.

13. A power conversion device configured to include:
a pair of DC terminals;

a DC-AC conversion circuit configured to connect two current switching devices for turning on and off a current in series between the DC terminals; and an AC terminal connected to a point to which the two current switching devices of the DC-AC conversion circuit are connected, wherein the current switching devices are the switching device for power conversion according to claim 10.

14. The switching device for power conversion according to claim 2, wherein the interval a between the first gate electrode and the second gate electrode that belong to the same group is less than or equal to 1 µm.

* * * * *